(12) United States Patent
McKenzie et al.

(10) Patent No.: US 7,741,842 B2
(45) Date of Patent: Jun. 22, 2010

(54) CALIBRATION MAPS FOR PARALLEL IMAGING FREE OF CHEMICAL SHIFT ARTIFACT

(75) Inventors: Charles A. McKenzie, London (CA); Scott B. Reeder, Middleton, WI (US); Ann Shimakawa, Palo Alto, CA (US)

(73) Assignees: The Board of Trustees of the Leland Stanford Junior University, Palo Alto, CA (US); General Electric Company, Schenectady, NY (US); Beth Israel Deaconess Medical Center, Boston, MA (US)

( * ) Notice: Subject to any disclaimer, the term of this patent is extended or adjusted under 35 U.S.C. 154(b) by 371 days.

(21) Appl. No.: 11/738,352

(22) Filed: Apr. 20, 2007

(65) Prior Publication Data

US 2007/0247154 A1 Oct. 25, 2007

Related U.S. Application Data

(60) Provisional application No. 60/745,602, filed on Apr. 25, 2006.

(51) Int. Cl.
*G01V 3/00* (2006.01)

(52) U.S. Cl. .................. 324/307; 324/309; 324/306

(58) Field of Classification Search ......... 324/300–322; 600/407–435; 424/9.3
See application file for complete search history.

(56) References Cited

U.S. PATENT DOCUMENTS

| | | | |
|---|---|---|---|
| 5,810,726 A | 9/1998 | Van Vaals et al. | 600/410 |
| 5,830,143 A | 11/1998 | Mistretta et al. | 600/420 |
| 5,910,728 A | 6/1999 | Sodickson | 324/309 |
| 5,976,088 A | 11/1999 | Urbano et al. | 600/443 |
| 6,086,537 A | 7/2000 | Urbano et al. | 600/443 |
| 6,181,134 B1 * | 1/2001 | Wald | 324/307 |
| 6,228,030 B1 | 5/2001 | Urbano et al. | 600/443 |
| 6,252,979 B1 | 6/2001 | Lee et al. | 382/133 |
| 6,289,232 B1 | 9/2001 | Jakob et al. | 600/410 |
| 6,377,045 B1 | 4/2002 | Van Den Brink et al. | 324/307 |
| 6,583,623 B1 | 6/2003 | Kwok et al. | 324/307 |
| 6,605,943 B1 | 8/2003 | Clark et al. | 324/309 |
| 6,714,010 B2 | 3/2004 | Madore | 324/307 |
| 6,836,114 B2 | 12/2004 | Reddy et al. | 324/307 |
| 6,903,551 B2 | 6/2005 | Madore | 324/309 |
| 7,151,370 B1 | 12/2006 | Hargreaves | 324/307 |
| 7,154,269 B1 * | 12/2006 | Haacke et al. | 324/309 |
| 7,176,683 B2 | 2/2007 | Reeder et al. | 324/307 |
| 7,199,583 B2 | 4/2007 | Ikezaki | 324/309 |
| 7,298,144 B2 | 11/2007 | Reeder et al. | 324/307 |

(Continued)

OTHER PUBLICATIONS

Notice of Allowance dated Aug. 22, 2008 from U.S. Appl. No. 11/738,350.

(Continued)

*Primary Examiner*—Brij B. Shrivastav
*Assistant Examiner*—Tiffany A Fetzner
(74) *Attorney, Agent, or Firm*—Beyer Law Group LLP

(57) ABSTRACT

A method for generating a calibrated parallel magnetic resonance image is provided in a manifestation of the invention. A magnetic resonance imaging excitation is applied. A plurality of echoes at different echo times (TE) is acquired. The acquired plurality of echoes from different echo times is used to create a chemical shift corrected calibration map.

9 Claims, 4 Drawing Sheets

U.S. PATENT DOCUMENTS

| | | | | |
|---|---|---|---|---|
| 7,332,909 | B2 | 2/2008 | Schaffter et al. | 324/309 |
| 7,349,729 | B2 | 3/2008 | Reeder et al. | 600/410 |
| 7,394,252 | B1 | 7/2008 | Lin | 324/309 |
| 7,397,242 | B2 | 7/2008 | Samsonov et al. | 324/309 |
| 7,418,287 | B2 | 8/2008 | Tsao et al. | 600/410 |
| 2001/0003423 | A1* | 6/2001 | Wald | 324/307 |
| 2001/0054898 | A1* | 12/2001 | Li et al. | 324/307 |
| 2004/0166062 | A1* | 8/2004 | Roberts et al. | 424/9.3 |
| 2005/0085713 | A1* | 4/2005 | Reeder et al. | 600/422 |
| 2005/0148852 | A1 | 7/2005 | Tank | 600/407 |
| 2007/0247153 | A1 | 10/2007 | Yu et al. | 324/307 |

OTHER PUBLICATIONS

Office Action dated Oct. 29, 2008 from U.S. Appl. No. 11/738,339.
Notice of Allowance dated Nov. 13, 2008 from U.S. Appl. No. 11/738,345.
Notice of Allowance dated Sep. 29, 2008 from U.S. Appl. No. 11/738,347.
Notice of Allowance dated Sep. 22, 2008 from U.S. Appl. No. 11/738,340.
Office Action dated May 28, 2008 from U.S. Appl. No. 11/738,350.
Office Action dated Jun. 18, 2008 from U.S. Appl. No. 11/738,345.
An et al., "Chemical Shift Imaging with Spectrum Modeling", Magn. Reson. Med. (2001) 46(1):126-130.
An et al., "Water-Fat Imaging with Three Orthogonal-Phase Acquisitions", Proceedings 6th Scientific Meeting, International Society for Magnetic Resonance in Medicine (1998), 1866.
Brau et al., "Accelerated IDEAL Water-Fat Separation Techniques for Single- and Multi-Coil Applications", Proc. Intl. Soc. Mag. Reson. Med. 13 (2005) p. 491.
Bydder et al., "Fat Quantification by Modeling the Variation in Signal Amplitude with TE", Proc. Intl. Soc. Mag. Reson. Med. 14 (2006) p. 2298.
Dixon, "Simple Proton Spectroscopic Imaging", Radiology (1984) 153:189-194.
Fernandez-Real et al., "Cross-Talk between Iron Metabolism and Diabetes", Diabetes (2002), 51(8):2348-2354.
George et al., "Increased Hepatic Iron Concentration in Nonalcoholic Steatohepatitis is Associated with Increased Fibrosis", Gastroenterology (1998), 114(2):311-318.
McKenzie et al., "Abdominal Three Point Dixon Imaging with Self Calibrating Parallel MRI", in Proc. Intl. Soc. Mag. Reson. Med. 11 (2004), p. 917.
Moirand et al., "A New Syndrome of Liver Iron Overload with Normal Transferin Saturation", The Lancet (1997); 349 (9045):95-97.
Pineda et al., "Cramer-Rao Bounds for Three-Point Decomposition of Water and Fat", Magn. Reson. Med. (2005) 54(3):625-635.
Reeder et al., "Iterative Decomposition of Water and Fat with Echo Asymmetry and Least-Squares Estimation (IDEAL): Application with Fast Spin-Echo Imaging", Magn. Reson. Med. (2005), 54(3):636-644.
Reeder et al., "Multicoil Dixon Chemical Species Separation with an Iterative Least-Squares Estimation Method", Magn. Reson. Med. (2004) 51:35-45.
Westphalen et al., "Liver Fat: Effect of Hepatic Iron Deposition on Evaluation with Opposed-Phase MR Imaging", Radiology (2007), 242(2):450-455.
Wieben et al., "Multi-Echo Balanced SSFP Imaging for Iterative Dixon Reconstruction", Proc. Intl. Soc. Mag. Reson. Med. 13 (2005), p. 2386.
Yu et al., "Field Map Estimation with a Region Growing Scheme for Iterative 3-Point Water-Fat Decomposition", Magn. Reson. Med. (2005) 54(3):1032-1039.
Yu et al., "Single Acquisition Water-Fat Separation: Feasibility Study for Dynamic Imaging", Magn. Reson. Med. (2006) 55(2): 413-422.
Yu et al., "Single Quadrature Echo Water-Fat Separation with Robust Phase Correction", Proc. Intl. Soc. Mag. Reson. Med. 14 (2006), p. 2446.
Office Action dated Dec. 29, 2008 from U.S. Appl. No. 11/738,343.
Notice of Allowance dated May 18, 2009 from U.S. Appl. No. 11/738,339.
Notice of Allowance dated Jun. 25, 2009 from U.S. Appl. No. 11/738,343.
Glover, G., "Multipoint Dixon Technique for Water and Fat Proton and Susceptibility Imaging", Journal of Magnetic Resonance Imaging (1991), 1:521-530.

* cited by examiner

CALIBRATION MAPS FOR PARALLEL IMAGING FREE OF CHEMICAL SHIFT ARTIFACT

CROSS REFERENCE TO RELATED APPLICATIONS

This application claims priority under 35 U.S.C. §119 from U.S. Provisional Patent Application No. 60/745,602, filed Apr. 25, 2006, entitled MRI METHODS FOR COMBINING SEPARATE SPECIES AND QUANTIFYING A SPECIES which is incorporated herein by reference for all purposes.

BACKGROUND OF THE INVENTION

This invention relates generally to magnetic resonance imaging, and more particularly the invention relates to species imaging in the presence of magnetic field heterogeneity.

Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underline pathology. Although conventional fat saturation may be adequate for areas of the body with relative homogeneous $B_o$ field, there may be many applications in which fat saturation routinely fails. This is particularly true for extremity imaging, off-isocenter imaging, large field of view (FOV) imaging, and challenging areas such as the brachial plexus and skull based, as well as many others. Short-TI inversion recovery (STIR) imaging provides uniform fat suppression, but at a cost of reduced signal-to-noise ratio (SNR) and mixed contrast that is dependent on $T_1$. This latter disadvantage limits STIR imaging to $T_2$ weighted ($T_2W$) applications, such that current $T_1$ weighted ($T_1W$) applications rely solely on conventional fat-saturation methods. Another fat suppression technique is the use of spectral-spatial or water selective pulses; however, this method is also sensitive to field inhomogeneities.

"In and Out of Phase" Imaging was first described by Dixon in "Simple Proton Spectroscopic Imaging", Radiology (1984) 153:189-194, and was used to exploit the difference in chemical shifts between water and fat and in order to separate water and fat into separate images. Glover et al. further refined this approach, described in Glover G., "Multipoint Dixon Technique for Water and Fat Proton and Susceptibility Imaging", Journal of Magnetic Resonance Imaging (1991) 1:521-530, with a 3-point method that accounts for magnetic field inhomogeneities created by susceptibility differences. This method was applied with FSE imaging by acquiring three images with the readout centered at the spin-echo for one image and symmetrically before and after the spin-echo in the subsequent two images.

Such multiecho imaging may use parallel imaging to increase scanning speed. Parallel imaging requires precise knowledge of spatial distribution of the sensitivity array of RF coils.

SUMMARY OF THE INVENTION

To achieve the foregoing and in accordance with the purpose of the present invention, a method for generating a calibrated parallel magnetic resonance image is provided. A magnetic resonance imaging excitation is applied. A plurality of echoes at different echo times (TE) is acquired. The acquired plurality of echoes from different echo times is used to create a chemical shift corrected calibration map.

In another manifestation of the invention a method for generating a calibrated parallel multiecho magnetic resonance image is provided. A magnetic resonance imaging excitation is applied. A plurality of echoes is acquired at different echo times (TE). The acquired plurality of echoes is used to provide a first species signal. The acquired plurality of echoes is used to provide a second species signal. The first species signal and the second species signal are combined with chemical shift correction to obtain a chemical shift corrected calibration map.

In another manifestation of the invention, an apparatus for providing a calibrated parallel multiecho magnetic resonance image is provided. A magnet system is provided. A controller is electrically connected to the magnet system and comprises a display, at least one processor, and computer readable media. The computer readable media comprises computer readable code for signaling the magnetic system to apply a magnetic resonance imaging excitation, computer readable code for signaling the magnetic system to acquire a plurality of magnetic resonance image echo signals at different echo times, and computer readable codes for using the acquired plurality of echoes from different echo times to create a chemical shift corrected calibration map.

The invention, objects, and features thereof will be more readily apparent from the following detailed description and appended claims when taken with the drawings.

DETAILED DESCRIPTION OF ILLUSTRATED EMBODIMENTS

"Sensitivity calibration" is performed by acquiring one or more images from each coil in an array and then processing those images to remove spin density information, leaving only a map of the sensitivity of each coil. The images used for sensitivity calibration should be of high SNR to avoid introducing error into the calibration, so low bandwidth imaging is preferable. The magnitude of the chemical shift artifact increases as bandwidth is reduced so signal from distant fat, for example, can contaminate the signal from water in a given pixel. Since the signal from fat will have information about the sensitivity at that distant site, the sensitivity calibration can be corrupted by chemical shift artifact. This corruption will introduce errors into the sensitivity calibration that will manifest as aliasing artifacts in any images reconstructed from the erroneous sensitivity.

To avoid this problem, a set of IDEAL images could be collected for use in sensitivity calibration. The images could be recombined with chemical shift correction, thus eliminating chemical shift as a source of error. These chemical shift corrected images could be processed into sensitivity maps using standard sensitivity calibration techniques.

Figure 1:
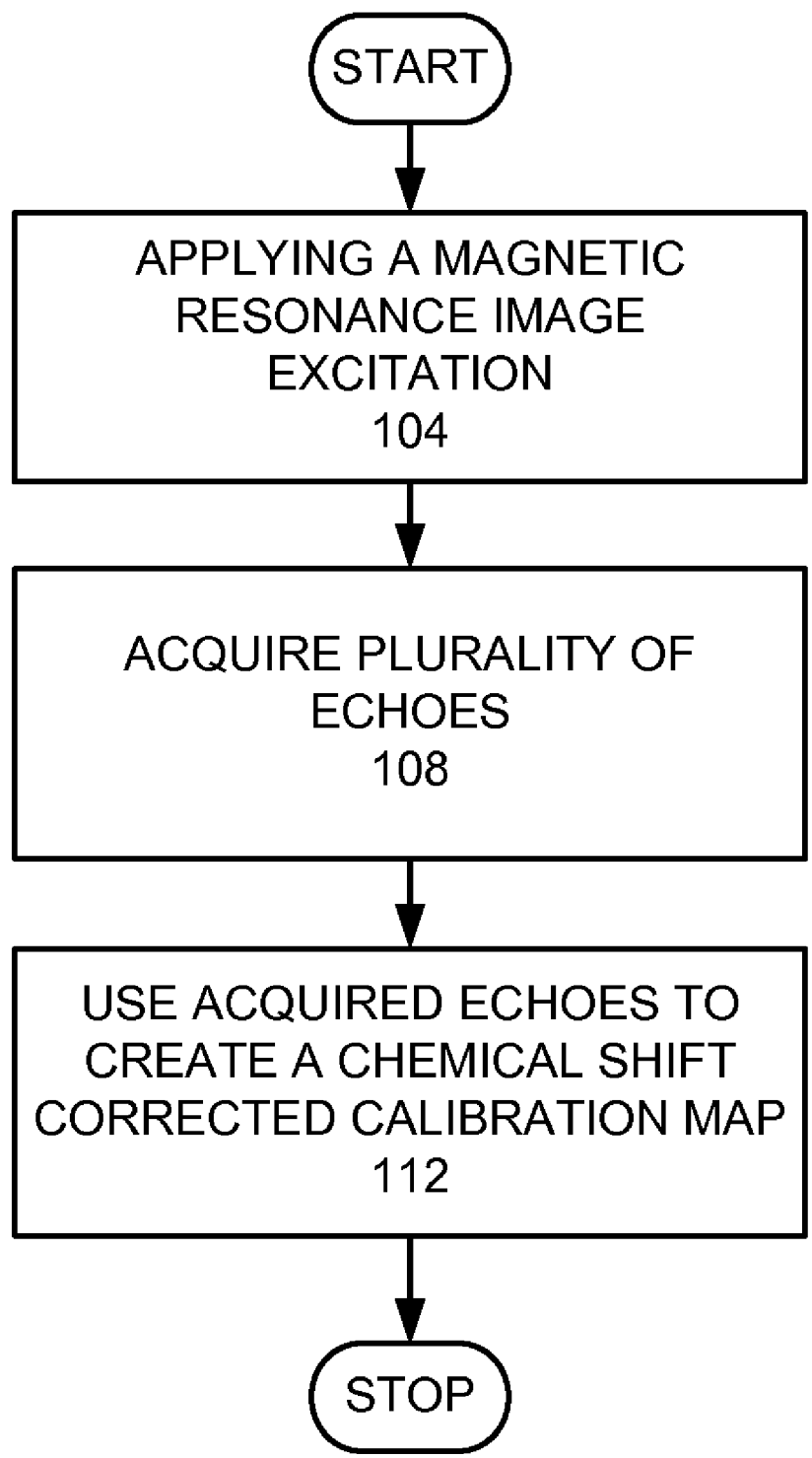
FIG. 1 is a high level flow chart of an embodiment of the invention.

FIG. 1 is a high level flow chart of an embodiment of the invention. A magnetic resonance image excitation is applied (step 104). A plurality of echoes is acquired (step 108). The acquired echoes are used to create a chemical shift corrected calibration map (step 112).

EXAMPLES

Figure 2:
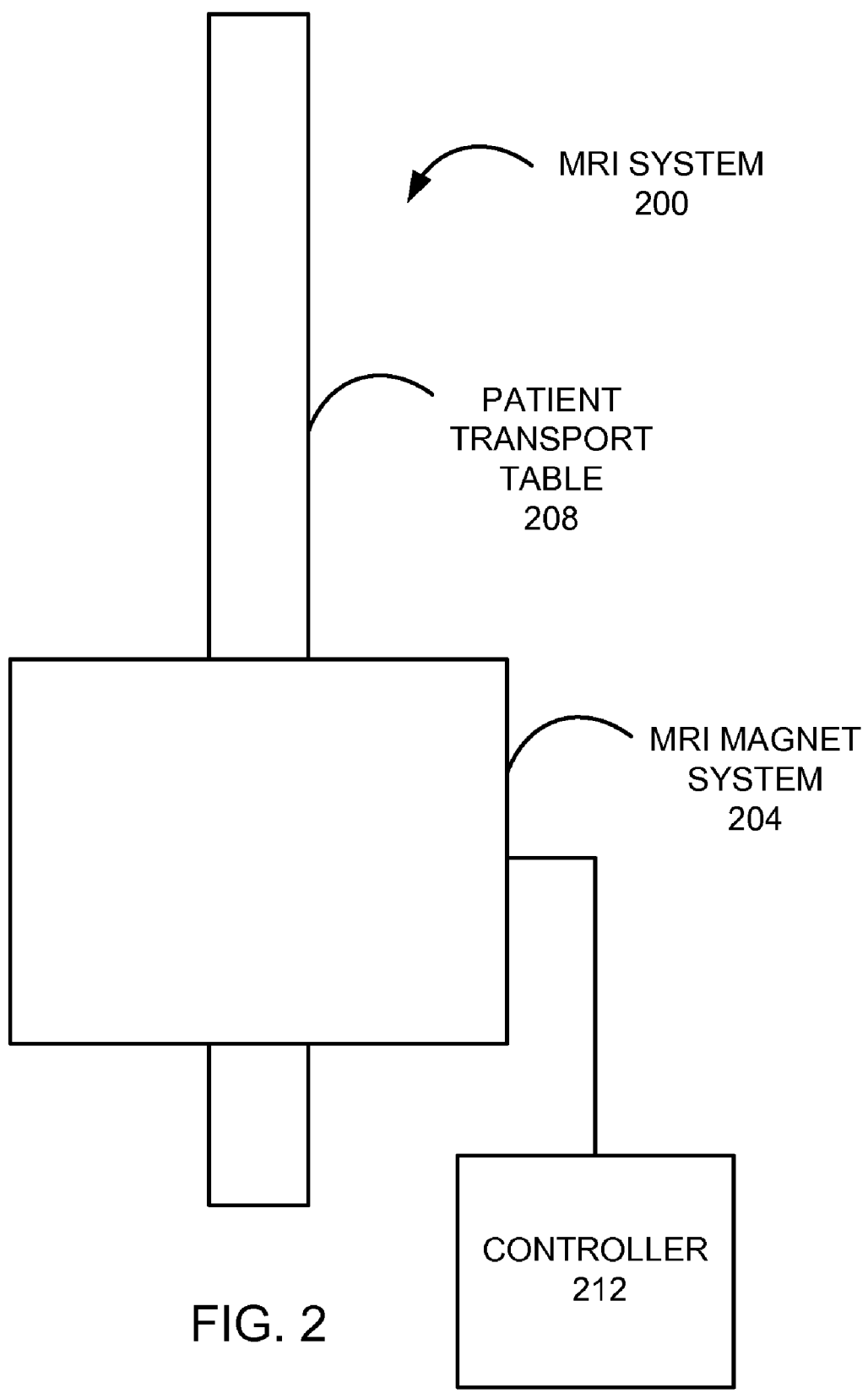
FIG. 2 is a schematic top view of a magnetic resonance imaging (MRI) system 200 that may be used in an embodiment of the invention.

FIG. 2 is a schematic top view of a magnetic resonance imaging (MRI) system 200 that may be used in an embodiment of the invention. The MRI system 200 comprises a magnet system 204, a patient transport table 208 connected to the magnet system, and a controller 212 controllably connected to the magnet system. In one example, a patient would lie on the patient transport table 208 and the magnet system 204 would pass around the patient. The controller 212 would control magnetic fields and radio frequency (RF) signals provided by the magnet system 204 and would receive signals from detectors in the magnet system 204.

Figure 3A:
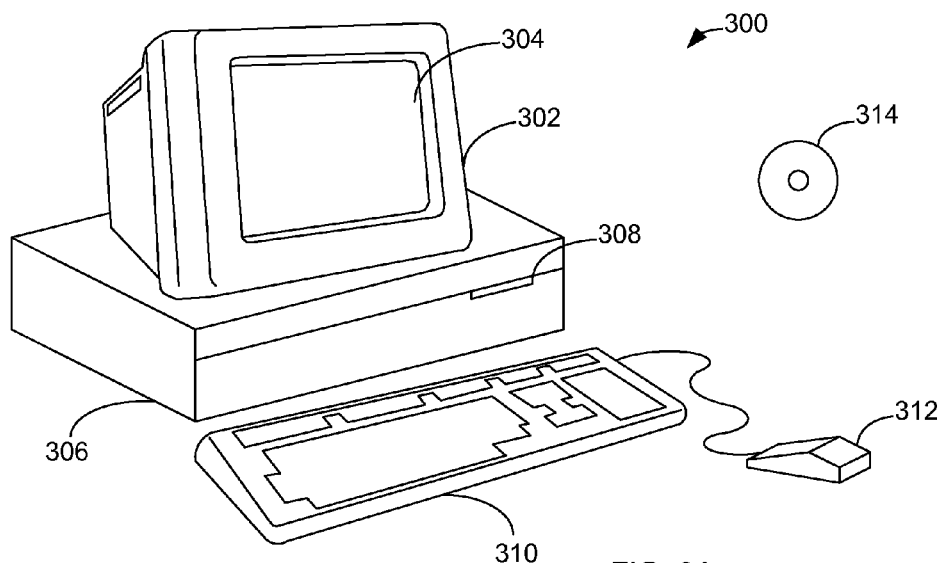
FIGS. 3A and 3B illustrate a computer system, which is suitable for implementing a controller 212 used in embodiments of the present invention.
Figure 3B:
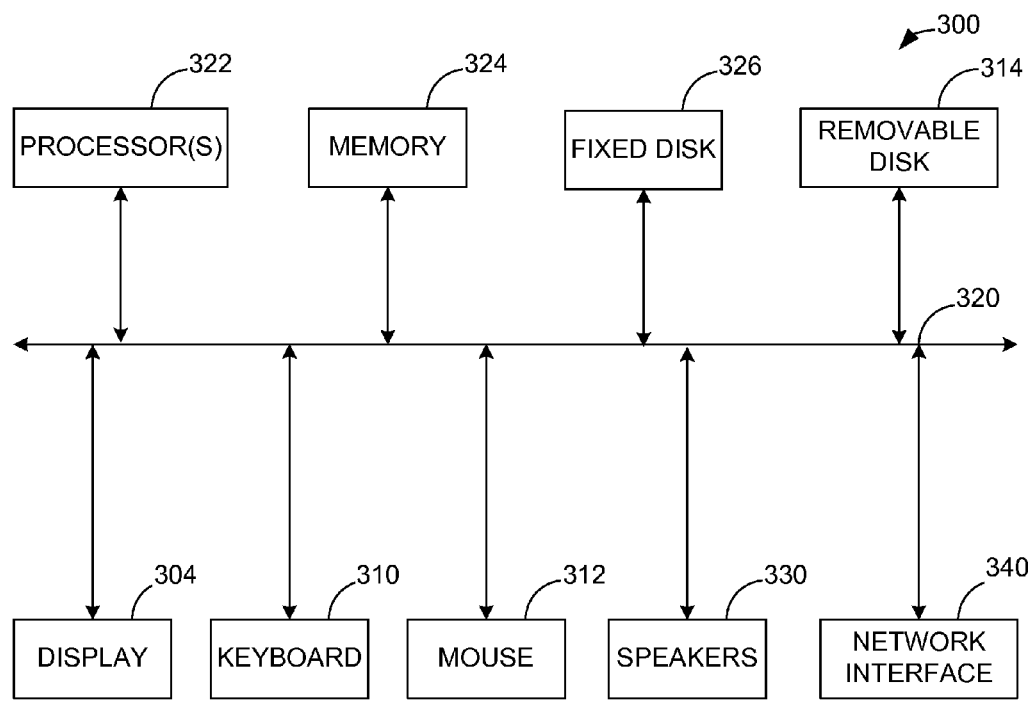

FIGS. 3A and 3B illustrate a computer system 300, which is suitable for implementing a controller 212 used in embodiments of the present invention. FIG. 3A shows one possible physical form of the computer system. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In a more specific example, the above apparatus is used. The controller 212 signals the magnet system 204 to apply a magnetic resonance imaging excitation (step 104). The magnet system 204 acquires a plurality of echoes at different echo times (TE) (step 108). In this example, three echoes are acquired at different echo times from a single magnetic resonance imaging excitation. In this example, the different echo times are at different phases.

Figure 4:
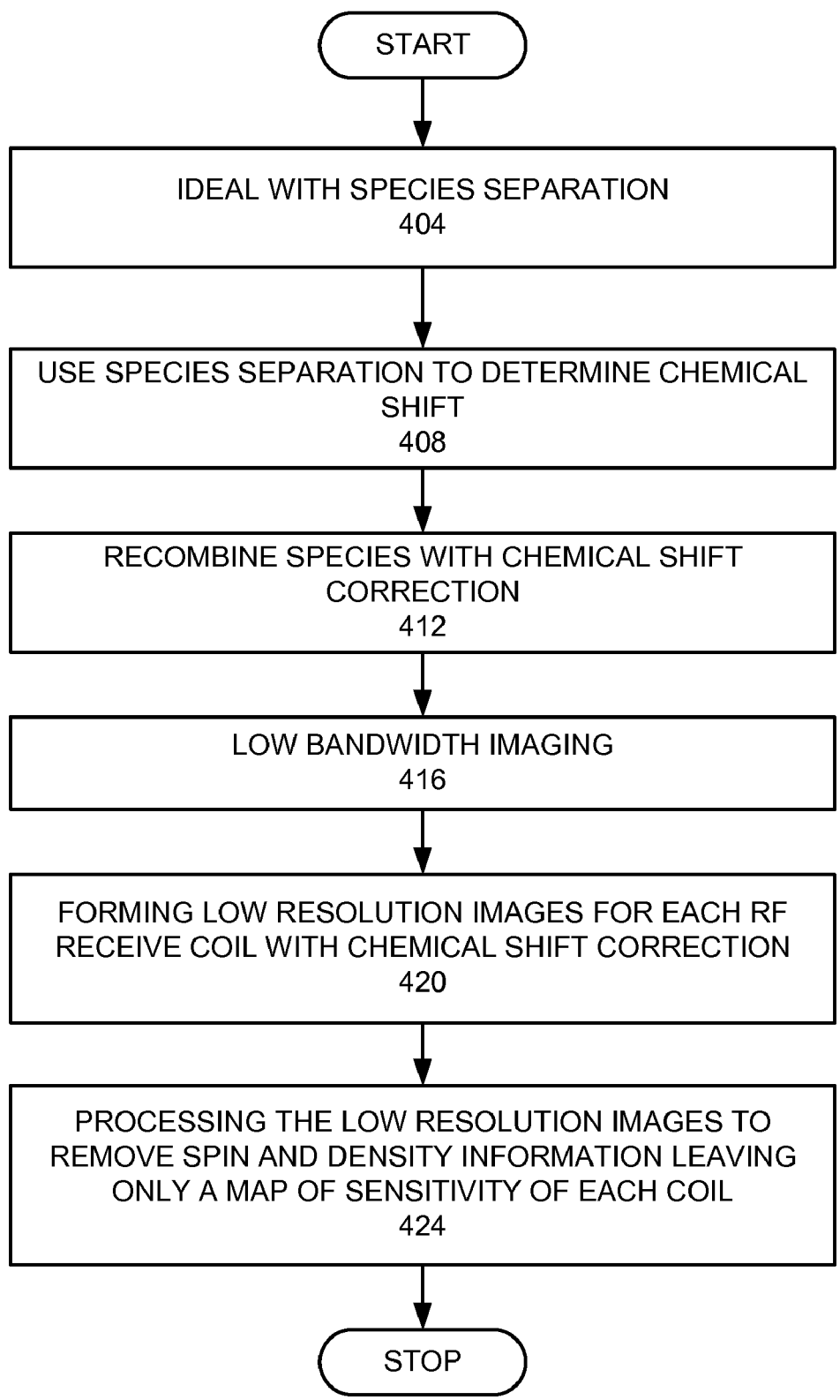
FIG. 4 is a more detailed flow chart of a step of using the acquired echoes to create a chemical shift corrected calibration map.

FIG. 4 is a more detailed flow chart of the step of using the acquired echoes to create a chemical shift corrected calibration map (step 112). In this example a Dixon species separation or iterative least-squared decomposition with echo asymmetry and least squares estimation (IDEAL) is applied to the acquired magnetic resonance data from the plurality of echoes and generate the first species signal and one or more additional species signals (step 404). In other examples, other processes are used. The species separation is used to determine chemical shift (step 408). In this example, the species signals are recombined with chemical shift correction (412). Low bandwidth imaging is used to create a chemical shift corrected image (step 416). Low resolution images are formed for each RF receive coil with chemical correction (step 420). The low resolution images are processed to remove spin and density information leaving only a map of sensitivity of each coil (step 424). Other examples may not use all of these steps or may use additional or alternative steps.

In another example, the shift corrected calibration could be used in a self-calibration process. An example of such a process would use a process where a plurality of echoes are acquired with a variable density undersampling pattern that densely samples the center of k-space for each echo. Low resolution images are formed from the densely sampled center k-space data for each echo. These low resolution images are processed with IDEAL to produce separate images for two or more chemical species for each RF receive coil. The species signals are recombined with chemical shift correction. The low resolution chemical shift corrected images are processed to remove spin and density information leaving only a map of sensitivity of each coil. This coil sensitivity map is then used to reconstruct fully sampled images from the variable density undersampled images in the usual manner for parallel imaging.

Chemical shift artifact can be corrected with IDEAL because the water and fat, or any other set of two or more species with different chemical shifts, have been separated into different images that can be realigned. Chemical shift correction is routinely performed in the IDEAL reconstruction and presents a new opportunity for improved SNR performance by imaging at lower bandwidths and higher field strengths without increases in bandwidth, while avoiding chemical shift artifact in the recombined images. Typically, the lower limit of image bandwidth is determined by the level of chemical shift artifact. Chemical shift artifact correction with IDEAL may be routinely performed.

IDEAL is particularly well suited for imaging at 3.0 T, and possibly higher field strengths, because the chemical shift between water and fat doubles from approximately −210 Hz at 1.5 T to −420 Hz. As a result, the spacing between echoes is reduced in half, improving the overall efficiency of the pulse sequence by reducing the minimum TR of the sequence. In addition, the spacing between consecutive echo groups is also smaller (1.2 ms at 3.0 T vs. 2.4 ms at 1.5 T), which also improves sequence efficiency and flexibility while still imaging with an optimal echo combination.

The main disadvantage of IDEAL imaging is its long minimum scan time compared with conventional imaging, which may be problematic for breath-held applications and dynamic contrast enhanced imaging. Despite the increased scan time, IDEAL is a very SNR efficient pulse sequence when the optimal echo spacing is used, generating separate water and fat images with SNR equivalent to three averages of a single image acquisition. For multi-coil applications, this problem can be addressed in part by using parallel imaging accelerations. As shown in several examples above, parallel imaging is fully compatible with IDEAL water-fat decomposition. For low acceleration factors (R=2-3), the SNR losses from the parallel acceleration are completely offset by the high SNR efficiency of IDEAL, making these methods highly complementary. Details of this work are described in H. Yu, S. Reeder, A. Shimakawa, J. Brittain, N. Pelc, "Field Map Estimation with a Region Growing Scheme for Iterative 3-Point Water-Fat Decomposition", Magn. Reson. Med. (2005) 54(3): 1032-1039. Other methods that can help reduce scan time include partial $k_y$ and $k_z$ acquisitions reconstructed with new homodyne algorithms compatible with IDEAL, as well as reduced acquisition schemes that include two-point and single-point acquisition methods.

Other examples provide spatial shifting of one of the species signals, the chemical shift between two species may be reduced or eliminated.

The generation of a first species signal and a second species signal from the same magnetic resonance data is described in U.S. patent application Ser. No. 10/690,230, by Reeder et al. entitled "Magnetic Resonance Imaging of Different Chemical Species in a System Having Magnetic Field Heterogeneities," filed on Oct. 23, 2003, which is incorporated by reference for all purposes.

The recombining and/or the conditioning may perform various operations, such as an arithmetic operation, such as multiplying the signal by a factor or adding two signals together or performing another mathematical operation, such as using a trigonometric function or using a logarithmic function of the signal.

An example of the invention uses relaxation times ($T_1$, $T_2$, $T_2^*$) and corrects the relaxation times for quantification of a species. Species that have a short $T_1$, recover faster and therefore have a higher intensity signal, appearing brighter than other species. A correction factor (or weight) may be used to correct this. For short $T_2^*$ periods, the presence of iron may correct the $T_2^*$ measurement. Different species such as fat and water may require different corrections. By providing a separate fat signal and a separate water signal, the different corrections may be provided to the different signals.

It was demonstrated that the decomposition of water from fat with symmetrically acquired echoes cannot be achieved when the proportions of water and fat within a voxel are approximately equal. A complete characterization of the theoretical maximum noise performance of water-fat decomposition, including the effects of the field inhomogeneities estimation, was reported in A. Pineda, S. Reeder, Z. Wen, H. Yu, N. Pelc Cramer-Rao, "Bounds for 3-Point Decomposition of Water and Fat", Magn. Reson. Med. (2005) 54(3):625-635 (hereinafter Pineda et al.). This work showed that the theoretical ability of all water-fat separation methods to decompose water from fat in a voxel is dependent on the relative proportions of water and fat, as well as the position of acquired echoes relative to the spin-echo. The dependence on the proportions of water and fat is particularly true for echoes that are acquired symmetrically about the spin-echo. This theory has been extended to spoiled gradient echo imaging (SPGR).

Optimal echo times predicted by Pineda et al. acquire the second of the three echoes in quadrature, re: the phase between the water and fat is such that water and fat are perpendicular to one another i.e. $\pi/2+\pi k$, k=any integer, The first and third echoes are subsequently acquired $2\pi/3$ before and after the second echo, respectively. Such echo combinations have been shown to provide the optimal noise performance for a fat-water separation acquisition. The use of different k-groups permits great flexibility with pulse sequences such as spoiled gradient echo imaging. This has been found and shown to be an effective method at both 1.5 and 3.0 T.

Brau A C, McKenzie C A, Shimakawa A, Yu H, Brittain J H, Reeder S B, in "Optimized 2+ Point IDEAL for Accelerated Water-Fat Separation," in The Radiological Society of North America 91$^{st}$ Meeting, Book of Abstracts, December 2005 described a second reduced data acquisition method, known as '2+'. In the 2+ method, two full resolution images of the 'IDEAL' echo times are acquired and a third lower resolution image is also obtained. Using the central lines of k-space that are common to all three images, three low resolution images are obtained after Fourier transformation. Conventional IDEAL estimation is then performed to obtain a low resolution field map from the three low resolution images. The phase shifts generated by the low resolution field map are subsequently demodulated from the two high resolution complex images, and from these demodulated images water and fat separation can be performed in the usual manner with the least-squares estimation. In this way, high resolution, high SNR images with robust water-fat separation can be obtained with an approximately 30 percent scan time reduction from conventional 3-point IDEAL water-fat separation. This scan time reduction is obtained without the use of parallel imaging. In the work by Brau et al., parallel accelerations were also applied. In addition, the low resolution image obtained as part of the fat-water separation acquisition was used as a calibration scan to measure coil sensitivity, necessary for parallel imaging accelerations.

The invention may be uses with any method that produces separate water and fat images, and therefore is not limited to IDEAL, which has the potential to measure complex coil sensitivity maps that are free of the effects of chemical shift artifact. Chemical shift artifact may corrupt coil sensitivity maps unless fat signal is suppressed or appropriate corrections have been made. The invention allows IDEAL or a related fat-water separation method to have the potential to correct for chemical shift when computing coil sensitivities as follows: with separated complex water and complex fat images, there will be a relative chemical shift between the two images. The chemical shift in pixels is equal to the chemical shift (Hz)/$BW_{pix}$, i.e. the amount of chemical shift per $Bw_{pix}$. Since the chemical shift is known (e.g. −210 Hz at 1.5 T) and the $BW_{pix}$ is known, the chemical shift artifact is known. For example, with a total BW of ±32 kHz and a 320-sample point readout, the $BW_{pix}$=64000/320=200, so that the chemical shift artifact will be −210/200 or just over 1 pixel. Because the water and fat images all have been separated, a simple shift of the fat image to realign it with the water image will correct for chemical shift artifact. This will produce coil sensitivities that are free of the effects of chemical shift artifact and also facilitate the acquisition of calibration maps with lower bandwidths, which improve SNR performance.

In U.S. patent application Ser. No. 10/690,230, by Pelc and Reeder, entitled "Magnetic Resonance Imaging of Different Chemical Species in a System Having a Magnetic Field Heterogeneities" filed on Oct. 20, 2003, which is incorporated by reference for all purposes, teaches that using least squares.

As described earlier, IDEAL provides a unique opportunity to correct for chemical shift artifact. As explained above, it does so by realigning water and fat images given the knowledge of the known chemical shift between water and fat. Although this correction is known and has been proposed previously for chemical shift artifact in the read-out direction, an embodiment of the invention uses this in order to correct for chemical shift artifact in the phase encoding direction for sequences that sample multiple time points after the TE, specifically echo planar imaging and related pulse sequences. Echo planar imaging currently relies on spectral-spatial pulses in order to excite only water signal. Unfortunately, these pulses can be very lengthy in duration and are relatively sensitive to $B_0$ inhomogeneities. It is extremely important to provide some form of robust fat suppression for echo-planar imaging because of the very large chemical shift that occurs in the phase encoding direction. For example, the time between subsequent read-out points in an echo-planar acquisition is approximately 1 ms, corresponding to an effective band-width in the phase encoded correction of 1,000 Hz. This corresponds to an approximate band-width per pixel of 5 to 10 Hz. This will result in a shift of fat signal by as much as 20 to 40 pixels, a significant portion of the field of view. This corrupts the image making echo-planar acquisitions without fat suppression non-diagnostic. An echo-planar IDEAL acquisition, however, would have the ability to separate the water and fat signal and subsequently realign them, eliminating the need for other fat suppression methods such as spectral spatial pulses.

Pineda et al. performed a comprehensive noise analysis of three-point water-fat separation methods. This work demonstrated that the theoretical optimal combination of echoes for a three-point fast spin-echo (FSE) acquisition occurred when the phase between water and fat phase was: $-\pi/6$, $\pi/2$, $7\pi/6$. This combination of echoes has been applied to FSE imaging using an iterative least-squares water-fat separation method that allows for arbitrarily and unequally spaced echo shifts. Experimental validation of the noise performance showed that the maximum possible SNR of the FSE water and fat images was achieved. This method has been applied to various FSE applications, including the ankle, brachial plexus and cervical spine, as well as balanced steady-state free precession (SSFP) imaging in the knee and heart.

Validation of the noise behavior for GRE imaging is important because the overall predicted noise behavior for gradient echo imaging is different than either FSE or SSFP imaging. It can be shown that the optimal choice of echoes that maximizes the noise performance of magnitude images leads to lower noise performance for the phase and field map for GRE imaging, compared to FSE or SSFP. This is related to the fact that all echo shifts for GRE imaging must be greater than zero, while echo shifts can be negative for FSE because echoes can be acquired before the refocusing of the spin-echo. This effect also occurs with SSFP, because of the 180° relative phase shift between water and fat at TE=TR/2 for certain choices of TR. Therefore, experimental validation of the noise performance for IDEAL-GRE imaging is necessary in order to show that the optimal noise performance is achievable even in the presence of higher uncertainty in the phase and field maps.

Theory:

Noise Performance

The noise performance of a water-fat decomposition is conveniently described with the effective number of signal averages, or NSA, defined as $$NSA = \frac{\sigma^2}{\sigma_\rho^2} \qquad (1)$$

where $\sigma^2$ is the variance of the noise in a source image and $\sigma_\rho^2$ is the variance of the noise in a calculated water or fat image. The NSA is a useful measure of the noise performance of a water-fat decomposition, and has an intuitive basis: For any three-point water-fat decomposition method, the maximum possible NSA is three, which is equivalent to what would be obtained if the object contained only water or only fat, and the three source images were averaged. Eq. 1 will be used experimentally to determine the noise performance of the IDEAL-GRE method.

Optimal Echo Shifts

The phase shift between water and fat from an echo acquired at time t relative to TE=0, can be written, $$\theta = 2\pi\Delta ft \qquad (2)$$

where $\Delta f$ is the chemical shift between water and fat, (−210 Hz at 1.5 T and −420 Hz at 3.0 T). Phase shifts are more convenient than echo shifts, because they are independent of field strength and are more intuitive, providing more physical meaning to the water-fat separation problem.

As predicted by Pineda et al., one set of optimal echo shifts for the three images occurs when the water-fat phase is, $1^{st}$ echo: $-\pi/6+\pi k$ $2^{nd}$ echo: $\pi/2+\pi k$ $3^{rd}$ echo: $7\pi/6+\pi k$, k=any integer  (3)

This echo combination has an intuitive basis as follows. In the "perfect" NMR experiment, there are no constant phase shifts or $B_o$ inhomogeneities, and an image acquired with an echo time that has water and fat in quadrature, i.e.: $\pi/2+\pi k$, can be used to separate water from fat with that single image: water and fat are simply the real and imaginary components of the complex image. However, the presence of unknown constant phase shifts and $B_o$ inhomogeneities requires additional information. The acquisition of two additional images 120°($2\pi/3$) before and after the second echo located at $\pi/2+\pi k$ provides uniform sampling around the unit circle, providing the optimal noise performance in the estimation of water and fat from the three source images. It is important to note, that the center echo must be in quadrature; echo combinations with the first or third echo in quadrature will not have optimum noise performance.

Echo shifts that satisfy Eq. 3 will have optimal noise performance. However, noise performance is poor when the second echo is acquired when water and fat are aligned, i.e.: any multiple of $2\pi$, even if the spacing between all three echoes remains at $2\pi/3$. In this case, the NSA is three when a voxel contains all water, but is significantly reduced for voxels that contain all fat, and has a broad minimum approaching zero for voxels containing mixtures of water and fat in near equal proportions. This echo combination can lead to image artifacts that include irregular margins at the interface between tissues with water signal (e.g. muscle) and fat signal (e.g. subcutaneous fat), as a result of partial volume effects. In addition, areas of the calculated water image that contain mostly fat signal (e.g. bone marrow and subcutaneous fat) appear noisy.

The choice of echo group, determined by the echo group index k, will depend on the minimum TE ($TE_{min}$) of the sequence. Typically, k is chosen to minimize the echo times, but ensure that they are all greater than $TE_{min}$. For example, at 1.5 T one possible echo combination for IDEAL-GRE imaging occurs for k=1, with echo shifts of 2.0 ms, 3.6 ms and 5.2 ms, so long as $TE_{min}$ is 2.0 ms or less. It is worthwhile to note that spacing between echo groups decreases with increasing field strength: the time between consecutive echo groups at 1.5 T is approximately 2.4 ms compared to a spacing of 1.2 ms at 3.0 T. The decrease in time between echo groups and the fact that echoes within a group are more closely spaced with increasing field strength makes IDEAL more flexible and more efficient for imaging at 3.0 T.

Pulse Sequence and Image Reconstruction

IDEAL uses an iterative least-squares method that is compatible with multi-coil imaging. In this method, an iterative method is used to determine the local field map ($B_o$ inhomogeneity) in the least squares sense. The field map is subsequently demodulated from the signal in the source images. This signal is then decomposed into separate water and fat signals using a least-squares solution matrix inversion. This latter step is similar to a least-squares approach described in L. An, Q. S. Xiang, "Chemical Shift Imaging with Spectrum Modeling", Magn. Reson. Med. (2001) 46(1):126-130 (hereinafter An), which is restricted to equally spaced echo shifts. IDEAL uses a region growing reconstruction algorithm to prevent water-fat "swaps" that can occur from the natural ambiguity between water and fat signals, e.g. for an acquisition at 1.5 T with the center frequency set to water, water that is off-resonance by −210 Hz has similar signal to fat that is on-resonance.

U.S. patent application Ser. No. 11/738,339 by Scott B. Reeder et al., entitled "MRI METHODS FOR COMBINING SEPARATE SPECIES AND QUANTIFYING A SPECIES" filed concurrently herewith, teaches MRI methods for combining separate species and quantifying a species; U.S. patent application Ser. No. 11/738,340 by Charles A. McKenzie et al., entitled "SELF-CALIBRATION METHODS FOR PARALLEL IMAGING AND MULTIPOINT WATER-FAT SEPARATION METHODS" filed concurrently herewith, teaches self-calibration methods for parallel imaging and multipoint water-fat separation methods; U.S. patent application Ser. No. 11/738,343 by Angel R. Pineda et al., entitled "MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI" filed concurrently herewith, teaches maximum likelihood estimator in the presence of non-identically distributed noise for decomposition of chemical species in MRI; U.S. patent application Ser. No. 11/738,345 by Zhifei Wen et al., entitled "REGULARIZED SPECIES SEPARATION" filed concurrently herewith, teaches regularized species separation; U.S. patent application Ser. No. 11/738,347 by Huanzhou Yu et al., entitled "SLIDING WINDOW RECONSTRUCTION AND PHASE/FIELD MAP UPDATING FOR DYNAMIC CHEMICAL SHIFT IMAGING" filed concurrently herewith, teaches sliding window reconstruction and phase/field map updating for dynamic chemical shift imaging; U.S. patent application Ser. No 11/738,350 by Huanzhou Yu et al., entitled "SIMULTANEOUS CHEMICAL SPECIES SEPARATION AND $T_2$* MEASUREMENT USING MRI" filed concurrently herewith, teaches simultaneous chemical species separation and $T_2$* measurement using MRI, all of which are incorporated by reference herein.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for generating a chemical shift corrected calibration map from one or more chemical shift corrected images, comprising:
   a) applying a magnetic resonance imaging excitation;
   b) acquiring a plurality of echoes at different echo times (TE);
   c) creating a plurality of chemical species signals from the plurality of echoes at different echo times;
   d) combining at least two of the plurality of chemical species signals to generate one or more chemical shift corrected images;
   e) generating a chemical shift corrected calibration map from the one or more chemical shift corrected images, wherein the chemical shift corrected calibration map provides a spatial distribution of sensitivity of an array of RF receive coils.

2. The method, as recited in claim 1, wherein the one or more chemical shift corrected images are generated using low bandwidth imaging.

3. The method, as recited in claim 1, wherein the one or more chemical shift corrected images are low resolution images for each RF receive coil of the array of RF receive coils; and generating a chemical shift corrected calibration map from the one or more chemical shift corrected images comprises processing the low resolution images to remove spin and density information, leaving only a chemical shift corrected calibration map of sensitivity of each RF receive coil.

4. The method, as recited in claim 3, wherein creating the plurality of chemical species signals from the plurality of echoes at different echo times and combining at least two of the plurality of chemical species signals to generate one or more chemical shift corrected images uses low bandwidth imaging.

5. The method, as recited in claim 4, wherein the creating the plurality of chemical species signals from the plurality of echoes at different echo times and combining at least two of the plurality of chemical species signals to generate one or more chemical shift corrected images further comprises using an iterative least-squared decomposition with echo asymmetry and least squares estimation.

6. The method, as recited in claim 1, further comprising generating a calibrated parallel magnetic resonance image from the acquired plurality of echoes using the chemical shift corrected calibration man.

7. A method for generating a calibrated parallel magnetic resonance image, comprising:
   a) applying a magnetic resonance imaging excitation;
   b) acquiring a plurality of echoes at different echo times (TE), wherein the acquiring the plurality of echoes acquires undersampled data;
   c) generating fully sampled, low resolution images at each of the different echo times (TE) that are lower resolution than the undersampled data;
   d) creating a chemical shift corrected calibration map from the fully sampled, low resolution images;
   e) generating fully sampled high resolution images from the undersampled data acquired at each echo time using the chemical shift corrected calibration map; and
   f) processing the fully sampled high resolution images with IDEAL to produce the calibrated parallel magnetic resonance image.

8. A method for generating a calibrated parallel magnetic resonance image, comprising:
   a) applying a magnetic resonance imaging excitation;
   b) acquiring a plurality of echoes at different echo times (TE); and
   c) using the acquired plurality of echoes from different echo times to create a chemical shift corrected calibration map, wherein the using the acquired plurality of echoes comprises:
      forming low resolution images for each RF receive coil of the array of RF receive coils from the acquired plurality of echoes; and
      processing the low resolution images to remove spin and density information, leaving only a chemical shift corrected calibration map of sensitivity of each coil; and
   d) generating the calibrated parallel magnetic resonance image from the acquired plurality of echoes using the chemical shift corrected calibration map.

9. A method for generating a calibrated parallel magnetic resonance image, comprising:
   a) applying a magnetic resonance imaging excitation;
   b) acquiring a plurality of echoes at different echo times (TE); and
   c) using the acquired plurality of echoes from different echo times to create a chemical shift corrected calibration map, wherein the using the acquired plurality of echoes comprises:
      using an iterative least-squared decomposition with echo asymmetry and least squares estimation (IDEAL) to provide a first species signal and a second species signal,
      combining the first species signal and the second species signal with chemical shift correction to obtain one or more chemical shift corrected images, and
      creating the chemical shift corrected calibration map from the one or more chemical shift corrected images; and
   d) generating the calibrated parallel magnetic resonance image from the plurality of echoes using the chemical shift corrected calibration map.

\* \* \* \* \*